United States Patent [19]
Tarte et al.

[11] Patent Number: 6,051,493
[45] Date of Patent: Apr. 18, 2000

[54] PROCESS FOR PROTECTING BONDED COMPONENTS FROM PLATING SHORTS

[75] Inventors: Lisa A. Tarte, Livermore; Wayne L. Bonde, Pleasanton; Paul G. Carey, Mountain View; Robert J. Contolini, Pleasanton; Anthony M. McCarthy, Menlo Park, all of Calif.

[73] Assignee: The Regents of the University of California, Oakland, Calif.

[21] Appl. No.: 08/323,410

[22] Filed: Oct. 14, 1994

[51] Int. Cl.⁷ .................................................. H01L 21/44
[52] U.S. Cl. ........................ 438/662; 205/123; 205/125
[58] Field of Search ................... 205/123, 125, 205/118; 437/192, 230; 257/776, 777; 438/662

[56] References Cited

U.S. PATENT DOCUMENTS

| | | | |
|---|---|---|---|
| 4,594,606 | 6/1986 | Goto | 257/776 |
| 4,624,749 | 11/1986 | Black | 205/50 |
| 4,965,646 | 10/1990 | Ipri | 257/387 |
| 5,098,526 | 3/1992 | Bernhardt | 205/125 |

OTHER PUBLICATIONS

Applied Surface Science 46 (1990) pp. 121–130, A.F. Bernhardt et al., "Multichip Packaging For Very–High–Speed Digital Systems", North–Holland Physics Publishing.

*Primary Examiner*—David Nelms
*Assistant Examiner*—Michael S. Lebentritt
*Attorney, Agent, or Firm*—L. E. Carnahan

[57] ABSTRACT

A method which protects the region between a component and the substrate onto which the components is bonded using an electrically insulating fillet of photoresist. The fillet protects the regions from subsequent plating with metal and therefore shorting the plated conductors which run down the sides of the component and onto the substrate.

12 Claims, 2 Drawing Sheets

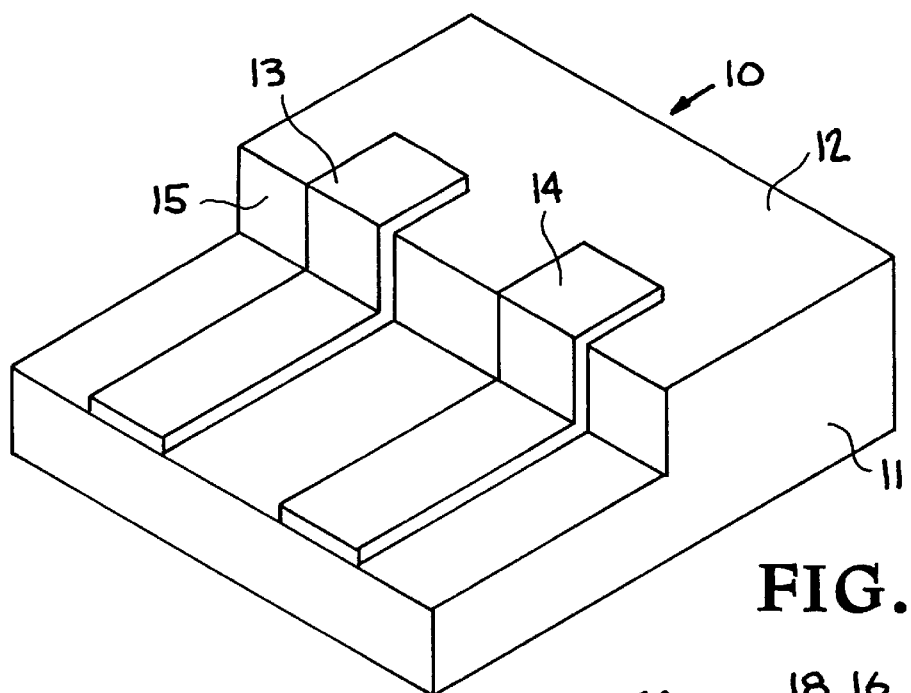
FIG. 1
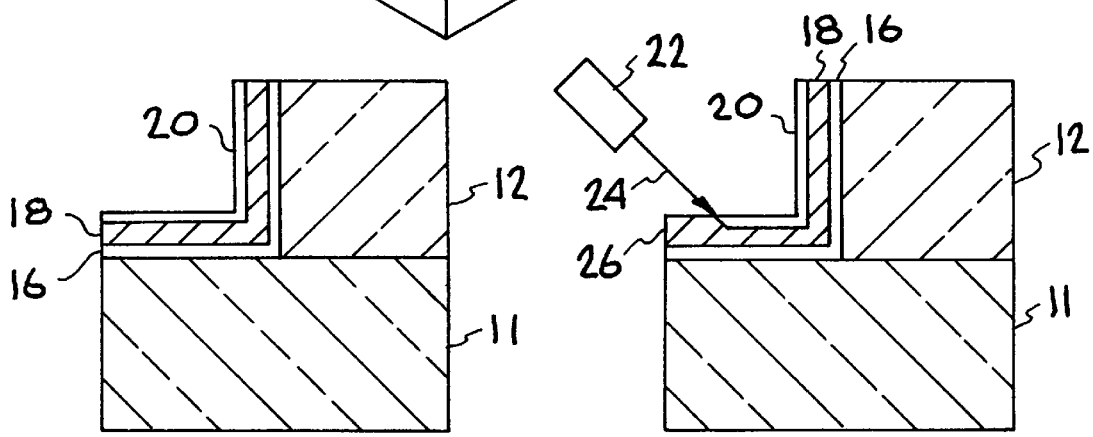
FIG. 2A
(PRIOR ART)
FIG. 2B
(PRIOR ART)
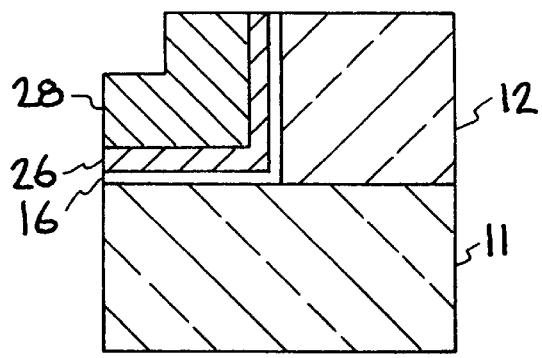
FIG. 2C
(PRIOR ART)

PROCESS FOR PROTECTING BONDED COMPONENTS FROM PLATING SHORTS

The United States Government has rights in this invention pursuant to Contract No. W-7405-ENG-48 between the United States Department of Energy and the University of California for the operation of Lawrence Livermore National Laboratory.

BACKGROUND OF THE INVENTION

The invention relates to preparation of a seed layer for selective metal deposition, particularly to a process utilizing a laser for preparation of a seed layer for selective metal deposition, and more particularly to a process for preventing conductor shorting after electroplating laser written conductor lines on selected portions of the seed layer.

U.S. Pat. No. 5,098,526 issued Mar. 24, 1992 to A. F. Bernhardt is directed to a process for the creation of plated metal interconnects from the surface of an integrated circuit (IC) chip, down the side of the chip, to contacts on the underlying circuit board, with the conductors being formed on the vertical sides of the chips, as well as on horizontal surfaces. The process of the above-mentioned U.S. Patent utilizes a seed layer upon which metal can be selectively deposited with the seed layer being formed by directing laser energy onto layers of electrical insulating material and a metal causing melting and intermixing thereof in locations or areas where surface activation is desired, thus enabling the deposition of a selected metal on the thus activated areas.

While the process of the above-referenced patent has produced satisfactory seed layers for selective metal deposition, conductor shorting problems have occurred because there is in some instances insufficient insulation material to insulate the metal layer underneath the perimeter region of the conductors from subsequent electroplating causing shorting between the conductor lines. Thus, a means of protecting the exposed metal under the conductor perimeter from being electroplated is needed, while at the same time allowing the full electroplating of the laser written conductor lines of the above-referenced patent.

The above-mentioned need is satisfied by the present invention which provides an improved seed layer forming process which prevents conductor shorting due to electroplating.

SUMMARY OF THE INVENTION

It is an object of this invention to provide protection from electroplating shorts during fabrication of electronic components.

A further object of this invention is to provide an improved process for preparation of a seed layer on components to enable selective metal deposition thereon while eliminating shorting due to the metal deposition.

Another object of the invention is to provide an improved laser based process for preparation of an activated seed layer upon which a selected metal may be deposited without adverse shorting created by depositing the metal.

Other objects and advantages of the present invention will become apparent from the following description and accompanying drawings. Basically, the present invention constitutes an improvement over the process for preparation of a seed layer for selective metal deposition which is described and claimed in above-referenced U.S. Pat. No. 5,098,526 issued to A. F. Bernhardt. It has been found that under certain conditions conductor shorting problems occur after electroplating of the laser written conductor lines when using the process of the above-referenced patent. The present invention overcomes the above-mentioned shorting problems by providing sufficient insulation between the activated seed layer and the underneath perimeter region of the components on which the seed layer is formed to prevent shorting of the conductor lines via the perimeter regions during subsequent electroplating. This is accomplished by providing a photoresist over the seed layer and then removing same except in the perimeter regions thereby providing sufficient insulation to prevent shorting of the laser written conductor lines during electroplating.

BRIEF DESCRIPTION OF THE DRAWINGS

The accompanying drawings, which are incorporated into and form a part of the disclosure, illustrate an embodiment of the invention and, together with the description, serve to explain the principles of the invention.

FIG. 1 is a highly magnified perspective view of a typical semiconductor prepared in accordance with the process of this invention, and is similar in appearance to that of U.S. Pat. No. 5,098,526 issued to A. F. Bernhardt.

FIGS. 2A–2C are cross-sectional side views of a portion of a semiconductor before and after being subjected to the process of above-referenced U.S. Pat. No. 5,098,526.

DETAILED DESCRIPTION OF THE INVENTION

Figure 3A:
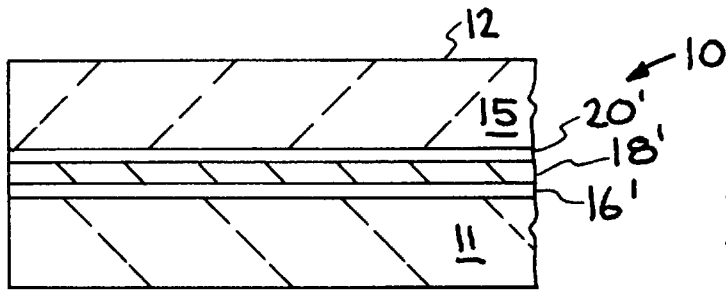
FIGS. 3A and 3B are partial front views of a semiconductor and similar to that of FIGS. 2A and 2B but with portions thereof shown in cross-section.

The invention is a process to protect laser written, and electroplated conductors from shorting to each other. The process of this invention protects the region between the seed layer and the semiconductor (substrate and/or IC chip) onto which the seed layer is bonded with an electrically insulating fillet of photoresist. The fillet protects the underneath perimeter regions from subsequently plating up with metal and therefore shorting the plated up conductors which, for example, run down the sides of the chip and onto the substrate, as shown in FIG. 1. This invention may be used in any process wherein an electric component is bonded upon a substrate and wherein there is a possibility that adjacent conductor lines may short out at the bottom edges thereof. Thus, while the present invention has particular application as an improvement of the seed layer forming process of above-referenced U.S. Pat. No. 5,098,526 it may be utilized in other applications where conductor shorting due to electroplating is a problem.

FIG. 1 illustrates a typical integrated circuit (IC) component generally indicated at 10 which can be fabricated in accordance with the process of the present invention and is similar in appearance to that illustrated in above-referenced U.S. Pat. No. 5,098,526. The circuit 10 comprises a substrate 11 upon which an integrated chip 12 containing electronic circuits is bonded or mounted. A plurality of metallic interconnects 13 and 14 connect the chip 12 with other chips, loose lines, etc., as known in the art. The metallic interconnect 13 and 14 are constructed to extend along the vertical wall 15 of chip 12 as well as the horizontal surfaces of the chip 12 and substrate 11. While only two metallic interconnects are shown, such may extend from the chip 12 in various directions as required by the overall circuit system.

FIGS. 2A–2C illustrate the process of above-referenced U.S. Pat. No. 5,098,526, with FIGS. 3A and 3B being similar to FIGS. 2A and 2B, but illustrating partial front cross-sectional views of the FIG. 1 IC component 10. As illustrated in FIGS. 2A–2B, a surface of the substrate 11 and IC chip 12, which may be composed of silicon dioxide, is covered with an adhesion layer 16 preferably a mixture of titanium (30%) and tungsten (70%), the Ti-W layer serving to promote adhesion between a metal layer 18, such as gold, and the silicon dioxide of substrate 11 and chip 12, as described in detail in above-referenced U.S. Pat. No. 5,098,526. An amorphous silicon insulator (inactive) layer 20 is then applied to the surface of the metal layer 18, as shown in FIG. 2A. Thereafter the inactive layer 20 is irradiated with a laser 22 having a beam 24 as indicated by an arrow, which melts the layer 20 and underlying metal layer 18 sufficient to cause intermixing of the two layers to form an alloy, mixture, or seed layer 26 and thereby activate the portion of the layers 18 and 20 underlying the laser beam, as shown in FIG. 2B. The activation of the layers and formation of alloy 26, enables subsequent plating of a metal 28, such as copper, to the alloy or seed layer 26, as seen in FIG. 2C to form the interconnects 13 and 14 of FIG. 1, and such is described in detail in the above-referenced patent FIGS. 3A and 3B may be formed as described above with respect to FIGS. 2A and 2B, and are thus given similar reference numerals. However, it is understood that components 11, 12, 16', 18', 20' and 26' may be composed of different materials than above-described and the layers 16', 18' and 20' may be deposited by various techniques.

Figure 4:
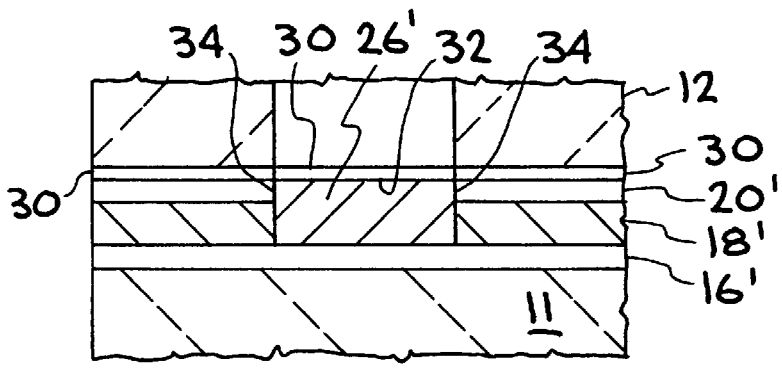
FIGS. 4, 5 and 6 are greatly enlarged sections of FIG. 3B which illustrate the improved process of this invention whereby conductor line shorting is prevented.
Figure 5:
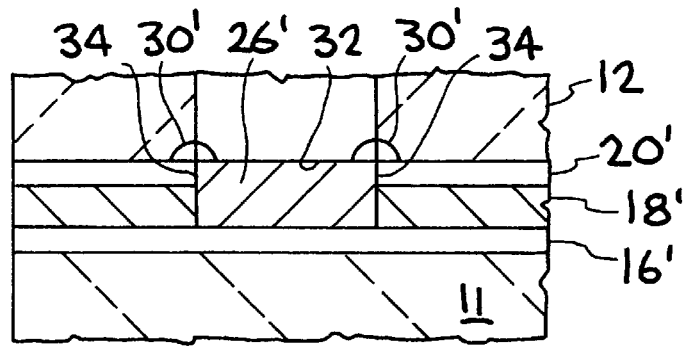
Figure 6:
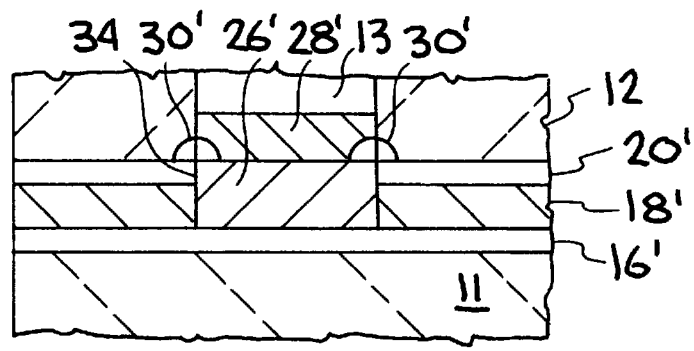

For purposes of illustration of the present invention, FIGS. 4, 5 and 6, show the improved process of this invention as an application to the integrated circuit component illustrated in FIGS. 2A–2B, and basically involves the formation of an insulating fillet of photoresist which protects underneath the perimeter region of the seed layer and insulates underlying material from subsequent electroplating.

Figure 3B:
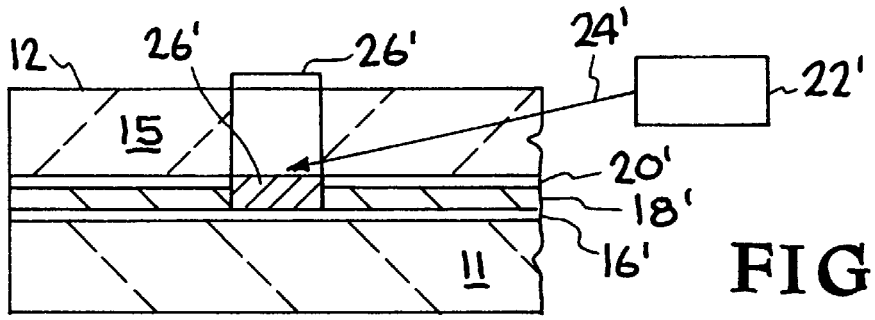

In an actual fabrication of the seed layer 26' as shown in FIGS. 3A and 3B, the surface of the seed layer is generally not flat as shown in FIG. 3B, but includes a sunken area having edge crevices as illustrated in FIGS. 4–6 and described hereinafter. It is the areas underneath the perimeter region or edge crevices where subsequent electroplating results in conductor shorting.

In the gold-silicon (Au-Si) alloying process of the above-referenced patent, conductor shorting problems occur after electroplating of the laser written conductor lines. In this prior process, as described above, an IC chip is bonded to a substrate and thin layers of titanium-tungsten, gold, and then silicon are sputtered on exposed surfaces of the chip and substrate. The silicon layer acts as an insulator to prevent electroplating except where a laser has heated and alloyed the Si and Au, making the alloy conductive and thus forming the desired seed layer. However, underneath the perimeter region of the seed layer there is insufficient silicon to insulate the gold from subsequent electroplating. Consequently, after laser writing and alloying of the desired conductor lines down the vertical side of the chip and onto the substrate, electroplating occurs not only on the laser written lines (seed layer), but also directly onto the exposed gold under the line or seed layer perimeter, causing shorting between the conductor lines.

The present invention as described hereinafter and illustrated in FIGS. 4–6 provides a means of protecting the exposed gold adjacent the conductor line or seed layer perimeter from being electroplated, while at the same time allows the full electroplating of the laser written conductor lines. This is accomplished by forming an insulating fillet on the seed layer perimeter or bottom edge crevice between the seed layer and the underlying gold layer.

After laser writing, as shown in FIG. 3B, to form the intermix, alloy, or activated seed layer 26', which may be level with or slightly raised above layer 20' the component 10 is immersed in dilute photoresist (or wax, or other insulating organic or inorganic solutions, such as spin on glass or polyimides) to form a photoresist or insulating layer 30 as seen in FIG. 4 which extends over and covers the upper surface 32 of seed layer 26' and edge crevices or perimeter regions 34 of seed layer 26'. The photoresist layer 30 is then baked and partially stripped by plasma ashing, for example, leaving only some insulating (photoresist) material or insulating fillets 30' covering the edge crevices or perimeter regions 34 between the seed layer 26' and the gold or other metal layer 18' on substrate 11 and chip 12, as shown in FIG. 5. Also, after application of the photoresist layer 30, it can be exposed to light, and developed. The exposure will allow all resist on top and side faces of the substrate 11 and chip 12 to develop away, but the bottom of the edge crevices between the seed layer and the gold layer will receive very little light and will not develop away.

Electroplating to form a metallic layer 28' can then be done on the seed layer 26', and the exposed gold of layer 18' under the perimeter of the seed layer will not electroplate because it is covered with insulating photoresist fillets 30', as shown in FIG. 6 for forming metallic interconnects 13 and 14 of FIG. 1. After electroplating, any exposed photoresist can be removed by acetone, other solvents, or photoresist developers or strippers, or further light exposure (at high angle to expose the underside of the seed layer), or extensive plasma ashing.

By way of example, the photoresist application and removal may be carried out as follows:

1. Immerse the component 10 in dilute photoresist composed of 1 part AZ 1350 Photoresist, a commercial chemical: 3 parts acetone, at a temperature of 22° C. to 25° C., for a time period of 45 sec. to 60 sec., pulling the component out slowly over a period of 5–10 seconds, to produce the photoresist layer 30 in FIG. 4 having a thickness of 100 Å to 2000 Å.
2. The photoresist layer 30 is then baked at a temperature of 90° C. to 100° C. for a time period of 20 to 30 minutes.
3. The photoresist layer 30 is then partially stripped by plasma ashing leaving only sections of layer 30, illustrated by fillets 30' as shown in FIG. 5, such being carried out by an oxygen plasma in a barrel plasma asher at a power of 200–250 watts, pressure of 50–150 torr, temperature of 25–50° C., and time of 7–20 minutes.

It has thus been shown that the present invention provides a process by which conductor shorting due to electroplating conductor lines is prevented. While this invention has particular application as an improvement of the process of above-referenced U.S. Pat. No. 5,098,526, it can be utilized wherever there is a possibility that adjacent conductor lines may short out at the bottom edges.

While particular components, application, materials, parameters, processing operations, etc. have been described or illustrated to set forth a full understanding of the invention, such are not intended to limit the invention. Modifications and changes will become apparent to those skilled in the art, and it is intended that the invention be limited only by the scope of the appended claims.

We claim:

1. In a process for forming a seed layer for selective metal deposition, the improvement comprising:

forming insulating fillets along the perimeter regions of the seed layer and an underlying layer for preventing electroplating of material adjacent the perimeter regions of the seed layer, the insulating fillets being formed by depositing a layer of insulating material on at least the entire surface of the seed layer and removing the insulating material except along the perimeter regions of the seed layer thereby forming the insulating fillets.

2. The improvement of claim 1, wherein said layer of insulating material is formed from a photoresist material.

3. The improvement of claim 2, wherein the layer of photoresist material is formed from a dilute photoresist and then baked.

4. The improvement of claim 3, wherein the removing of the insulating material is carried out by partially stripping using plasma ashing.

5. The improvement of claim 1, wherein the insulating fillets are formed from material selected from the group consisting of photoresist, wax, and other insulating organic materials.

6. In a process for selective metal deposition using laser writing to form activated seed layers for electroplating of a conductive metal thereon, the improvement comprising:

preventing conductor shorting due to the electroplating by providing means for protecting metallic material located adjacent the activated seed layer from being electroplated, the means being provided by forming electrically insulating fillets along edge crevices of the activated seed layer for insulating any exposed conductive material adjacent the perimeter regions of the activated seed layer.

7. The improvement of claim 6, wherein the electrically insulating fillets are formed from material selected from the group of photoresist, wax, and other insulating organic materials.

8. The improvement of claim 7, wherein the electrically insulating fillets are composed of a photoresist formed by immersing at least the activated seed layer in a dilute photoresist material to form a photoresist layer, baking the thus formed layer, and partially stripping the thus baked photoresist layer, leaving only fillets of photoresist along the edge crevices of the activated seed layer.

9. The improvement of claim 8, additionally including electroplating the activated seed layer with a conductive material, and removing any exposed photoresist fillet material by light exposure or plasma ashing.

10. The improvement of claim 9, wherein the removing of the fillet material is carried out using a solvent selected from the group of acetone, other solvents and photoresist developers or strippers.

11. The improvement of claim 7, wherein the electrically insulating fillets are formed from a photoresist layer which is exposed to light such that all resist on top and side faces of the layer are developed away leaving resist at the bottom edge crevices between the activated seed layer and adjacent conductive material.

12. The improvement of claim 11, wherein any exposed resist following electroplating of conductive material on the activated seed layer is removed by further light exposure.

* * * * *